(12) United States Patent
Wengreen

(10) Patent No.: US 10,199,782 B1
(45) Date of Patent: Feb. 5, 2019

(54) MOUNTING SYSTEMS FOR ELECTRONIC DEVICES

(71) Applicant: Innovelis, Inc., Sammamish, WA (US)

(72) Inventor: Eric John Wengreen, Sammamish, WA (US)

(73) Assignee: Innovelis, Inc., Sammamish, WA (US)

( * ) Notice: Subject to any disclaimer, the term of this patent is extended or adjusted under 35 U.S.C. 154(b) by 0 days.

(21) Appl. No.: 16/104,056

(22) Filed: Aug. 16, 2018

Related U.S. Application Data

(63) Continuation-in-part of application No. 16/045,581, filed on Jul. 25, 2018, and a continuation-in-part of application No. 29/655,528, filed on Jul. 4, 2018, and a continuation-in-part of application No. 29/654,151, filed on Jun. 21, 2018.

(60) Provisional application No. 62/685,879, filed on Jun. 15, 2018.

(51) Int. Cl.
*H01R 13/73* (2006.01)
*H05K 5/02* (2006.01)

(52) U.S. Cl.
CPC ........... *H01R 13/73* (2013.01); *H05K 5/0204* (2013.01); *H05K 5/0247* (2013.01)

(58) Field of Classification Search
CPC ............ H02G 3/08; H02G 3/081; H02G 3/14; H02G 3/18; H02G 3/10; H01B 17/22; H01R 24/60; H01R 24/30; H01R 25/006; H01R 13/73; H05K 5/0204; H05K 5/0247
USPC ......... 174/66, 67, 480, 481, 50, 53, 57, 135; 220/3.2, 3.3, 241, 242; 439/535, 536
See application file for complete search history.

(56) References Cited

U.S. PATENT DOCUMENTS

| | | | | |
|---|---|---|---|---|
| 3,689,868 A * | 9/1972 | Snyder | ................... | H01R 13/72 174/66 |
| 4,293,173 A | 10/1981 | Tricca | | |
| 4,749,360 A | 6/1988 | Dudley | | |
| 6,503,097 B2 * | 1/2003 | Archambault | ......... | H01R 13/60 439/4 |
| 7,230,181 B2 * | 6/2007 | Simmons | ............... | B65H 75/36 174/66 |
| 7,528,323 B2 * | 5/2009 | Wu | .......................... | H02G 3/14 174/66 |
| 8,088,999 B1 * | 1/2012 | Payou | ...................... | H02G 3/14 174/66 |
| 8,203,077 B2 * | 6/2012 | Honeycutt | ............... | H02G 3/32 174/66 |
| 8,864,517 B2 * | 10/2014 | Cohen | .................... | H01R 13/73 439/536 |
| 9,065,263 B2 * | 6/2015 | Porcano | ................... | H02G 3/14 |

(Continued)

OTHER PUBLICATIONS

Deluxe Mount by Dot Genie—Website (downloaded on Oct. 17, 2018 from https://www.amazon.com/Deluxe-Mount-Dot-Genie-Simplest/dp/B077T42FZY). Listed on Amazon.com at least as early as Nov. 29, 2017.

(Continued)

*Primary Examiner* — Angel R Estrada

(57) ABSTRACT

Mounting systems can couple an electronic device to a wall. Mounting systems can include a first cavity configured to hold a power adapter of the electronic device. Mounting systems can include a channel that wraps around the first cavity. The channel can be configured to store a cable that is coupled to the power adapter and wound around the channel. A sleeve can cover the cable stored in the cable storage area of the mounting system.

18 Claims, 17 Drawing Sheets

(56) References Cited

U.S. PATENT DOCUMENTS

| | | | |
|---|---|---|---|
| 9,551,454 B2* | 1/2017 | Lipke | H02G 3/14 |
| D795,820 S | 8/2017 | Wengreen | |
| 10,084,300 B1* | 9/2018 | Glahe | H02G 3/14 |
| 2017/0233217 A1 | 8/2017 | Wengreen | |

OTHER PUBLICATIONS

Matone Outlet Wall Mount—Website (downloaded on Oct. 17, 2018 from https://www.amazon.com/Matone-Assistants-Space-Saving-Solution-Speakers/dp/B078H7VY19). Listed on Amazon.com at least as early as Jan. 2, 2018.

Feiyen Outlet Wall Mount—Website (downloaded on Oct. 17, 2018 from https://www.amazon.com/Generation-Without-Compact-Kitchens-Bathroom/dp/B0756GYPNS). Listed on Amazon.com at least as early as Aug. 28, 2017.

EBoot Solid Metal Wall Mount—Website (downloaded on Oct. 17, 2018 from https://www.amazon.com/eBoot-Holder-Bracket-All-New-Generation/dp/B01MZ92KID). Listed on Amazon.com at least as early as Jan. 12, 2017.

* cited by examiner

MOUNTING SYSTEMS FOR ELECTRONIC DEVICES

CROSS-REFERENCE TO RELATED APPLICATIONS

The entire contents of the following application are incorporated by reference herein: U.S. Patent Application No. 62/685,879; filed Jun. 15, 2018; and entitled MOUNTING SYSTEMS FOR ELECTRONIC DEVICES.

The entire contents of the following application are incorporated by reference herein: U.S. patent application Ser. No. 29/654,151; filed Jun. 21, 2018; and entitled MOUNT FOR ELECTRONIC DEVICES.

The entire contents of the following application are incorporated by reference herein: U.S. patent application Ser. No. 29/655,528; filed Jul. 4, 2018; and entitled MOUNT FOR ELECTRONIC DEVICES.

The entire contents of the following application are incorporated by reference herein: U.S. patent application Ser. No. 16/045,581; filed Jul. 25, 2018; and entitled MOUNTING SYSTEMS FOR ELECTRONIC DEVICES.

BACKGROUND

Field

Various embodiments disclosed herein relate to mounting systems and mounting methods. Certain embodiments relate to mounting systems configured to couple electronic devices to a wall.

Description of Related Art

Mounting systems can couple electronic devices to an object such as a wall of a building or a power outlet of a building. The electronic devices, however, may be unstable and may not be fully secured by the mounting systems. Thus, there is a need for systems and methods to securely mount electronic devices to diverse types of walls and surfaces.

SUMMARY

Some embodiments comprise a mounting system configured to couple an electronic device to a wall of a building. The wall can comprise an electrical power outlet such that the power outlet couples the mounting system to a main planar surface of the wall. Mounting systems can comprise a base having a backside configured to face inward towards the wall and a frontside configured to face outward away from the wall. Mounting systems can comprise a first wall coupled to the base and configured to couple the electronic device to the base.

In some embodiments, mounting systems comprise a first cantilever beam and a second cantilever beam, which can be outward protrusions. Cantilever beams can be flex arms configured to flex to enable coupling an electronic device to the mounting system. The first cantilever beam and the second cantilever beam can be coupled to the base and can be configured to removably couple the electronic device to the base. The mounting system can comprise a first cavity configured to hold at least a portion of a power adapter of the electronic device. The mounting system can comprise a first channel that wraps around the first cavity. The first channel can be configured to store a cable coupled to the power adapter and wound around the first channel.

In several embodiments, the mounting system comprises a removable tube having a slot between a first side of the tube and a second side of the tube. The tube can be configured to flex to enlarge the slot to enable an inner diameter of the tube to increase to enable placing the tube at least partially over the first channel to at least partially hide the cable.

In several embodiments, the mounting system comprises a removable pin having an outer electrically insulative layer such that the pin is configured to not conduct electricity. The pin can be located partially in a hole of the base such that a first portion of the pin is located in a ground hole of a power outlet of the wall and an outward portion of the pin comprises a shoulder that is too large to fit through the hole. The shoulder can be located outward relative to the hole.

In some embodiments, the base comprises a second wall configured to be located between a power adapter of the electronic device and a power outlet of the wall.

In several embodiments, the second wall comprises at least one hole configured to enable a power prong of the power adapter to pass through the hole and into an electrical hole of the power outlet.

In several embodiments, the mounting system comprises the power adapter. The mounting system can comprise a first outward facing cavity. The second wall can be located on an inward end of the first outward facing cavity. The power adapter can be located at least partially inside the first outward facing cavity.

In some embodiments, the mounting system comprises a second outward facing cavity having a second outward facing opening that is larger than a first outward facing opening of the first outward facing cavity. An inward end of the second outward facing cavity can comprise an entrance hole to the first outward facing cavity. The power adapter can be located at least partially in both the first outward facing cavity and the second outward facing cavity.

In several embodiments, the power adapter is located at least partially in both the first outward facing cavity and the second outward facing cavity such that there is a first gap of at least 8 millimeters between a first sidewall of the second outward facing cavity and a first sidewall of the power adapter. There can be a second gap of at least 8 millimeters between a second sidewall of the second outward facing cavity and a second sidewall of the power adapter. The second sidewall of the second outward facing cavity can be located on an opposite side of the power adapter relative to the first sidewall of the second outward facing cavity. The first gap and the second gap can be configured to enable a user (e.g., a person) to insert fingers into the second outward facing cavity to grip the first and second sidewalls of the power adapter to enable the user to pull the power adapter outward away from the power outlet.

In some embodiments, the mounting system comprises a first outward facing cavity, the second wall is located on an inward end of the first outward facing cavity, and the first outward facing cavity is configured to hold at least a portion of the power adapter. The first outward facing cavity can comprise a central axis oriented from the inward end to an outward opening of the first outward facing cavity. The mounting system can comprise a second channel having an outward facing opening. The second channel can be oriented within thirty degrees of perpendicular to the central axis such that the second channel is configured to receive an electrical cable through the outward facing opening of the second channel in response to inserting the power adapter (that is coupled to the cable) at least partially into the first outward facing cavity.

In several embodiments, the base comprises a second wall configured to be located between a power adapter of the electronic device and a power outlet of the wall.

In some embodiments, the mounting system comprises a removable pin. The second wall can comprise a hole configured to enable a user to insert the pin into the hole and into a ground hole of the power outlet such that the pin is configured to help secure the base to the power outlet. The pin can comprise an electrically insulative exterior such that the pin is configured to not conduct electricity.

In several embodiments, the pin is located in the hole of the second wall such that an inward portion of the pin is located in the ground hole of the power outlet. The pin can comprise an outward portion having a shoulder with a radial dimension configured to prevent the shoulder from passing through the hole of the second wall.

In some embodiments, the mounting system comprises a first cavity configured to hold at least a portion of a power adapter of the electronic device. The mounting system can comprise a first channel that wraps around the first cavity. The first channel can be configured to store a cable that is coupled to the power adapter and wound around the first channel. The base can comprise a first disk that forms an inward wall of the first channel. The base can comprise a second disk that forms an outward wall of the first channel.

In several embodiments, the mounting system comprises a removable tube having a slot between a first side of the tube and a second side of the tube. The tube can be configured to flex to enlarge the slot to enable placing the tube at least partially over the first channel to at least partially hide the cable.

In some embodiments, the mounting system comprises an electronic device and a power adapter having a cable configured to be electrically coupled to the electronic device. The base can comprise a first cylinder coupled to a second cylinder that is located outward relative to the first cylinder. The power adapter can be located at least partially inside the first cylinder and at least partially inside the second cylinder. The cable can be wrapped at least partially around the first cylinder.

In several embodiments, the base comprises a cavity in which at least a portion of the power adapter is located. The cavity can comprise a second wall located between the power adapter and a power outlet of the wall. The second wall can comprise a hole. A power prong of the power adapter can protrude through the hole and into an electrical hole of the power outlet. As used herein, protrude, protrudes, and protrusion do not require motion.

In some embodiments, a third cylinder is coupled to the base such that the first cylinder is located between the third cylinder and the second cylinder. The first cylinder can comprise a first outer diameter. The second cylinder can comprise a second outer diameter. The third cylinder can comprise a third outer diameter. The first outer diameter can be smaller than the second outer diameter and the third outer diameter such that the second cylinder impedes a portion of the cable that is wrapped around the first cylinder from moving outward and the third cylinder impedes the portion from moving inward.

In several embodiments, the base comprises a cavity in which at least part of the power adapter is located. The cavity can be located at least partially inside the first cylinder. The mounting system can comprise a second channel oriented radially inward relative to the first cylinder. The second channel can be in fluid communication with the cavity and a cable storage area formed by the first cylinder and the second cylinder. The cable can exit the power adapter, pass through the second channel, and then wrap around the first cylinder.

In several embodiments, the mounting system comprises at least two cantilever beams that are coupled to the second cylinder, protrude outward from the second cylinder, and wrap at least partially around the electronic device to couple the electronic device to the second cylinder. The cantilever beams can be configured to flex in response to inserting the electronic device into an area between the cantilever beams. As used herein, protrude, protrudes, and protrusion do not require motion.

In some embodiments, the mounting system comprises a C-shaped sleeve having a slot between a first side of the sleeve and a second side of the sleeve. The sleeve can be configured to flex to enlarge the slot to enable placing the sleeve at least partially around the first cylinder. The sleeve can be located at least partially around the first cylinder such that the sleeve at least partially hides a portion of the cable that is wrapped around the first cylinder.

BRIEF DESCRIPTION OF THE DRAWINGS

These and other features, aspects, and advantages are described below with reference to the drawings, which are intended to illustrate, but not to limit, the invention. In the drawings, like reference characters denote corresponding features consistently throughout similar embodiments.

DETAILED DESCRIPTION

Although certain embodiments and examples are disclosed below, inventive subject matter extends beyond the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components.

For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Speakers can be mounted to walls. The wall can comprise an electrical power outlet such that the power outlet couples the mounting system to a main planar surface of the wall.

There are many types of speakers that can be used with the mount embodiments described herein. One speaker is the Echo Dot (Second Generation) made by Amazon.com, Inc. Another speaker is the Google Home Mini. Additional types of speakers can be used with the embodiments described herein.

The mount embodiments described below can be used to mount speakers to walls (e.g., via screws or adhesive) and/or to power outlets (e.g., via electrical prongs of a power adapter, a dummy ground pin, screws configured to enter a threaded hole of a power outlet, and/or adhesive).

A user can insert a pin into a hole of the mount. The pin can be plastic or metal and in some embodiments does not conduct electricity such that the pin is a "dummy" pin configured to help secure the mount to the power outlet.

A user can insert two electronic prongs of a power adapter into holes of the mount such that the pin is sandwiched between a surface of the mount and a surface of the power adapter. Then, the user can insert the prongs of the power adapter and the pin into the holes of the power outlet to secure the mount to the power outlet. (In some embodiments, the pin is part of the mount.) The pin can be located in the "ground" hole of the power outlet.

The mount, pin, and sleeve can be molded ABS plastic or can be any suitable material made by any suitable manufacturing process.

Figure 1:
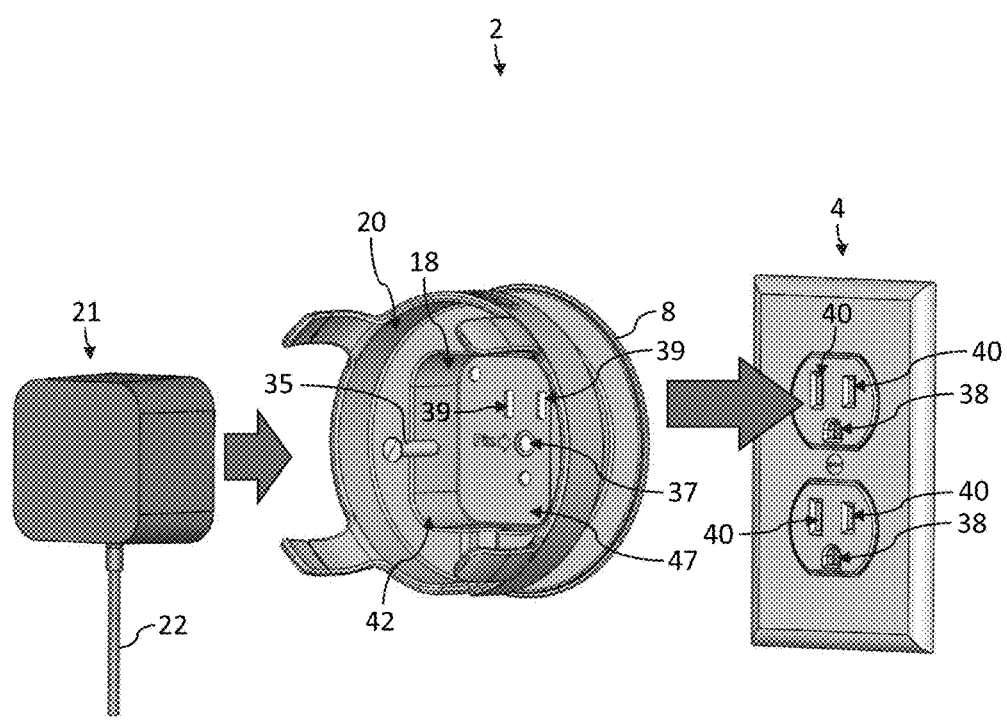
FIG. 1 illustrates a perspective view of a power adapter being inserted into a mounting system, according to some embodiments.
Figure 2:
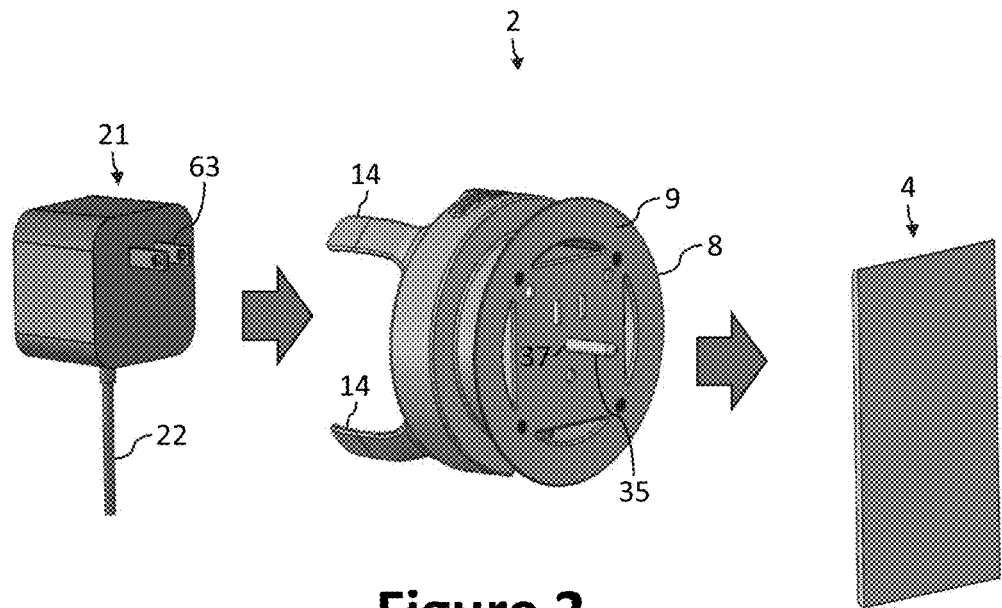
FIG. 2 illustrates a perspective view of a power adapter being inserted into a mounting system, according to some embodiments.
Figure 3:
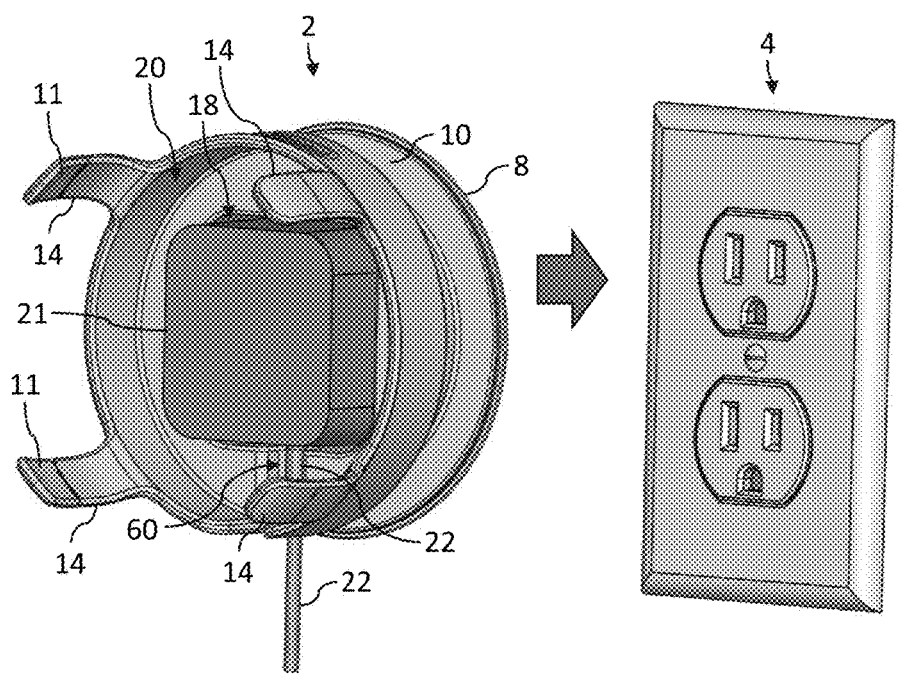
FIG. 3 illustrates a perspective view of a power adapter being inserted into a power outlet, according to some embodiments.
Figure 4:
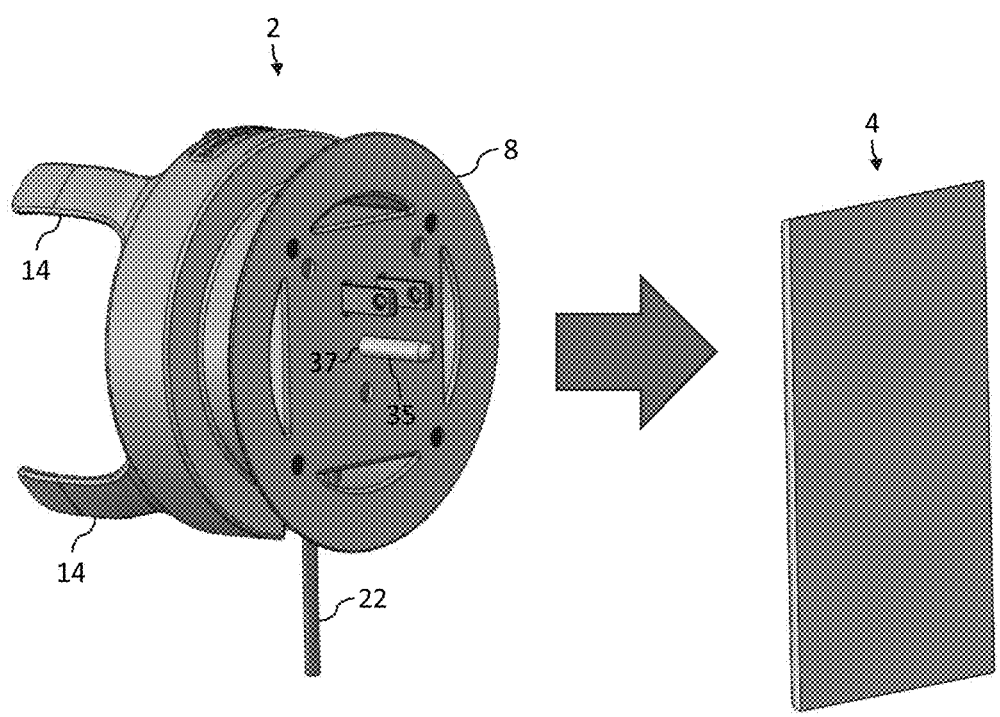
FIG. 4 illustrates a perspective view of a power adapter being inserted into a power outlet, according to some embodiments.
Figure 5:
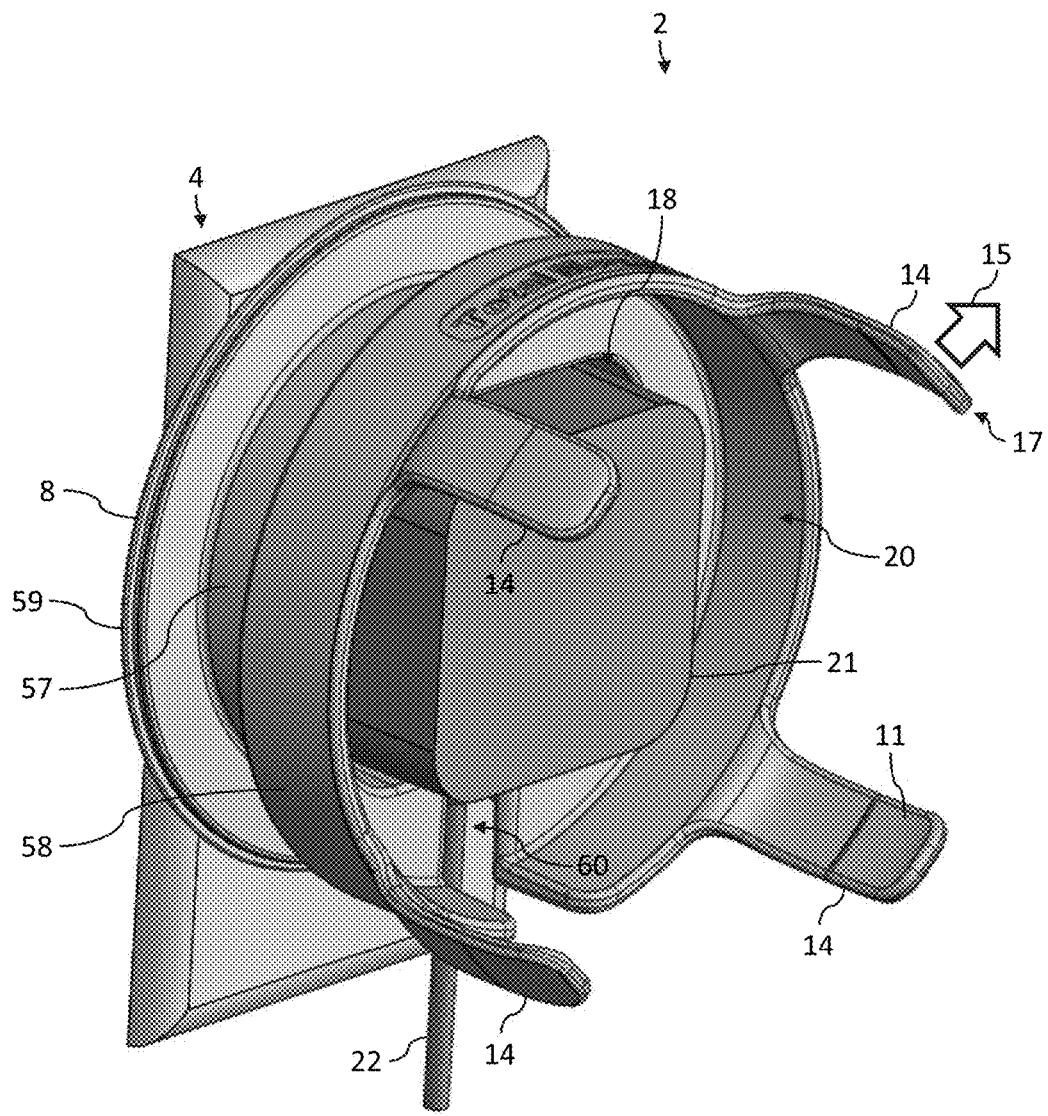
FIG. 5 illustrates a perspective view of a power adapter securing a mount to a power outlet, according to some embodiments.

Referring now to FIG. 3, a power adapter of the speaker system can be located partially inside a cavity of the mount to help hold the pin in place. As illustrated in FIG. 4, prongs of the power adapter and/or the pin can protrude out through holes on the backside of the mount. As illustrated in FIG. 5, the pin and prongs can hold the mount to the power outlet. The pin and prongs are located inside the corresponding holes of the power outlet such that the power adapter can receive electricity from the power outlet (e.g., via the prongs). The power adapter can provide electricity to the electronic device (e.g., a speaker system).

Figure 6:
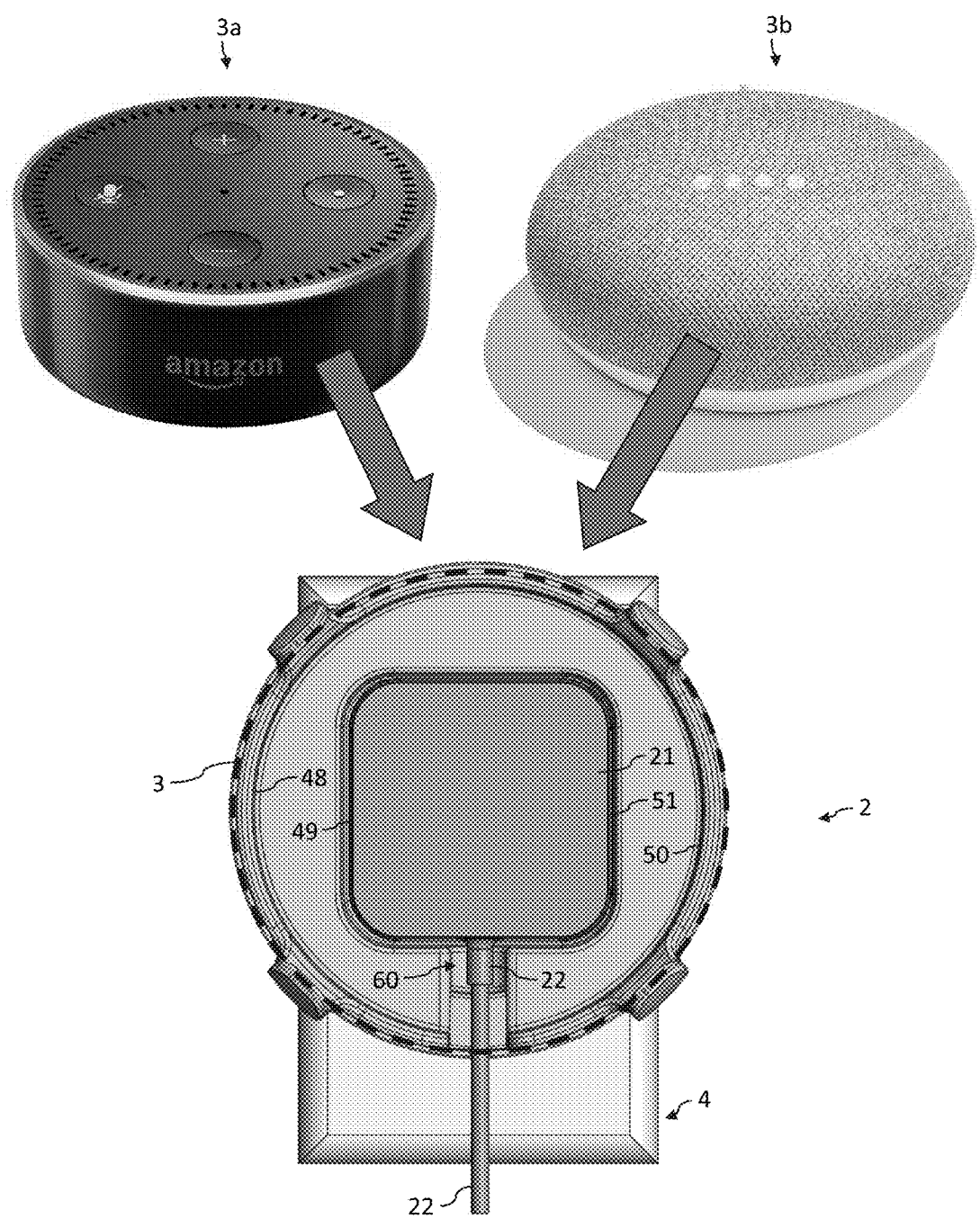
FIG. 6 illustrates a front view of a power adapter securing a mount to a power outlet and a perspective view of electronic devices that can be coupled to the power outlet by the mount, according to some embodiments.

As illustrated in FIG. 6, a speaker can be placed in the speaker area (as indicated by the broken line) such that the speaker is held in place by flex arms.

Figure 7:
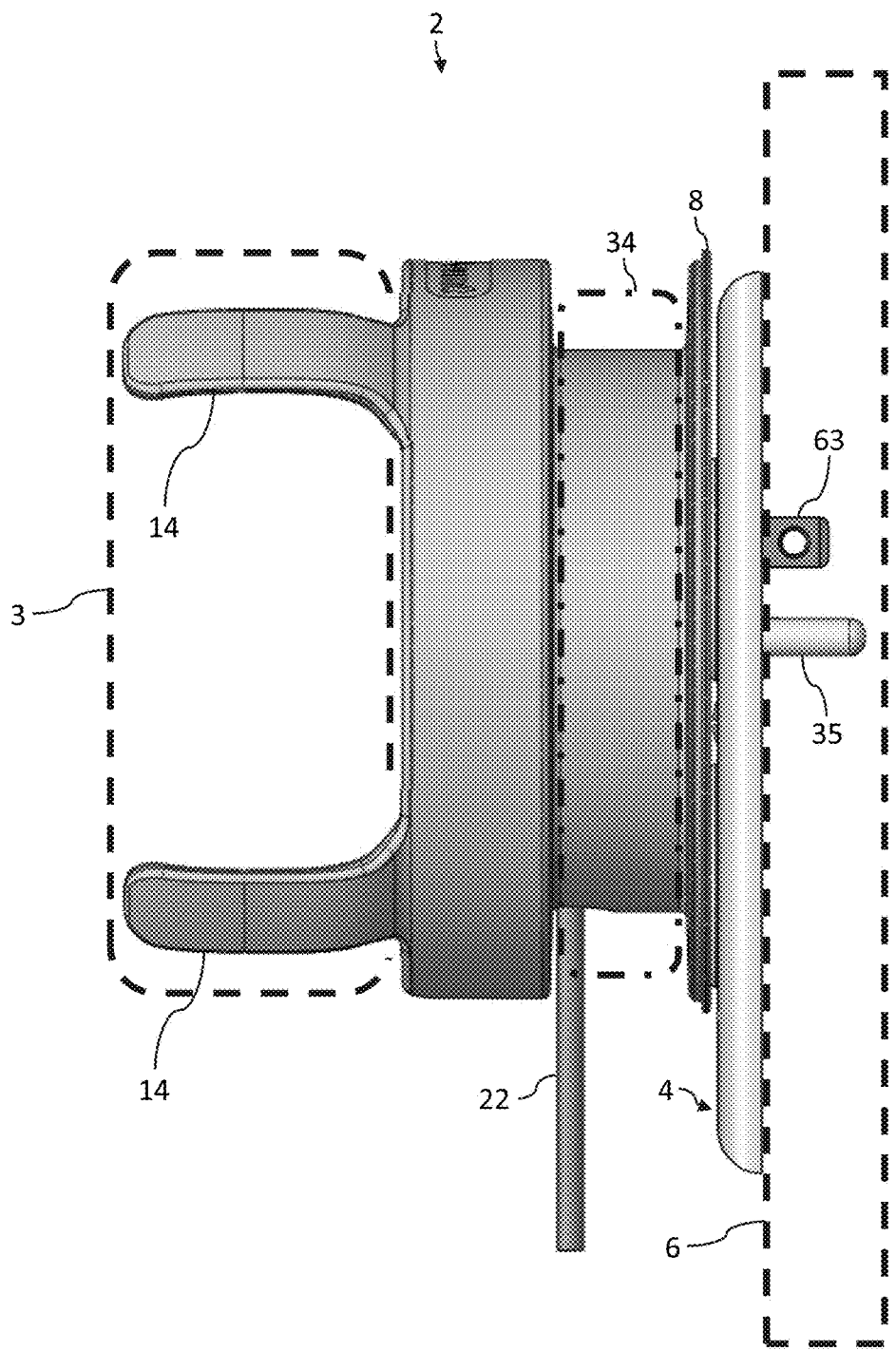
FIGS. 7 and 8 illustrate side views of a mount configured to couple an electronic device to a wall, according to some embodiments.
Figure 8:
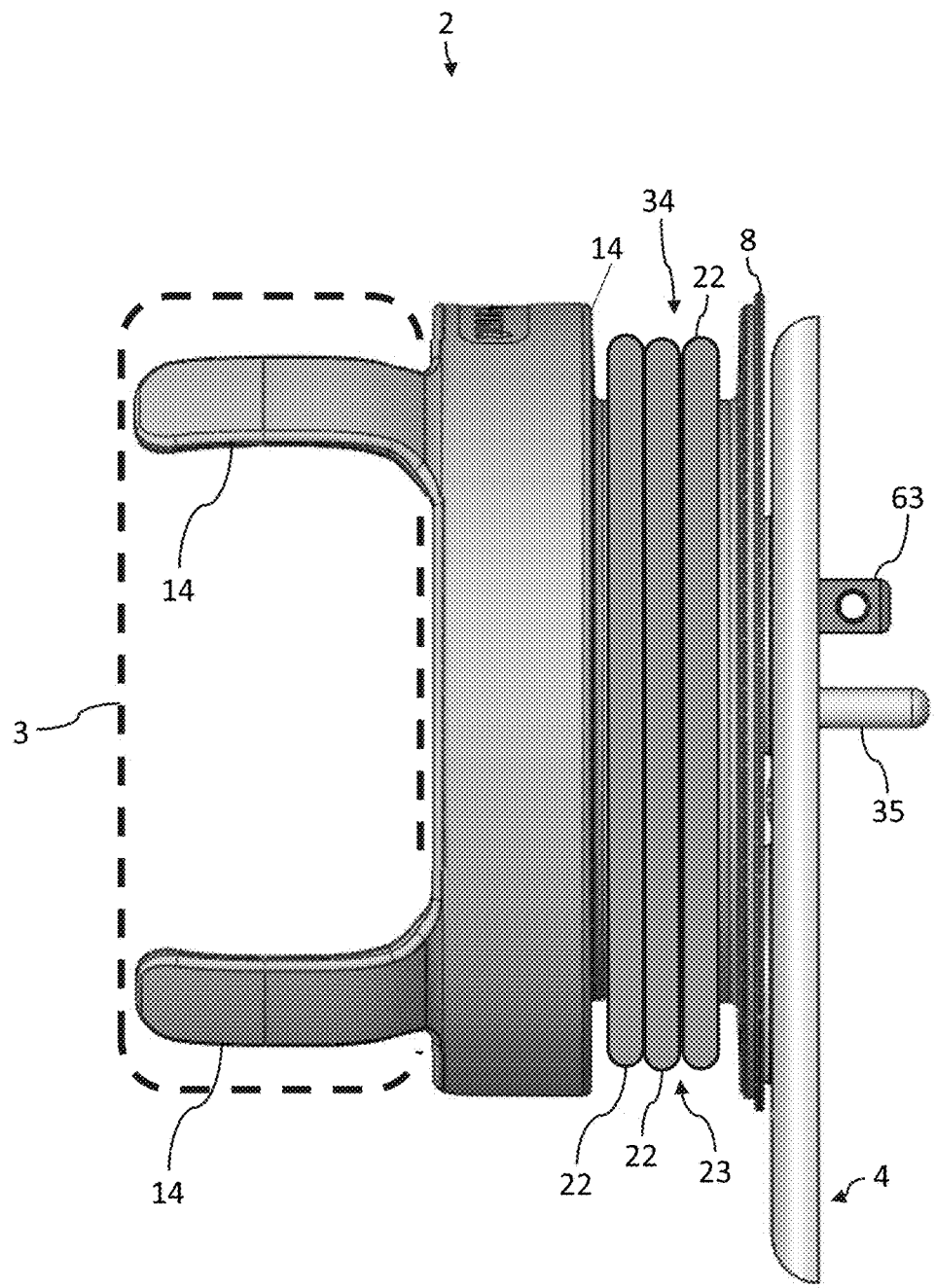

Referring now to FIGS. 7 and 8, a cable of the speaker's power adapter can be wrapped around a portion of the mount that at least partially contains the power adapter. This cable wrap area can be cylindrical. FIG. 8 illustrates the cable wrapped around a cylindrical cable wrap area of the mount between an outer sidewall and an inner sidewall of the mount.

Figure 9:
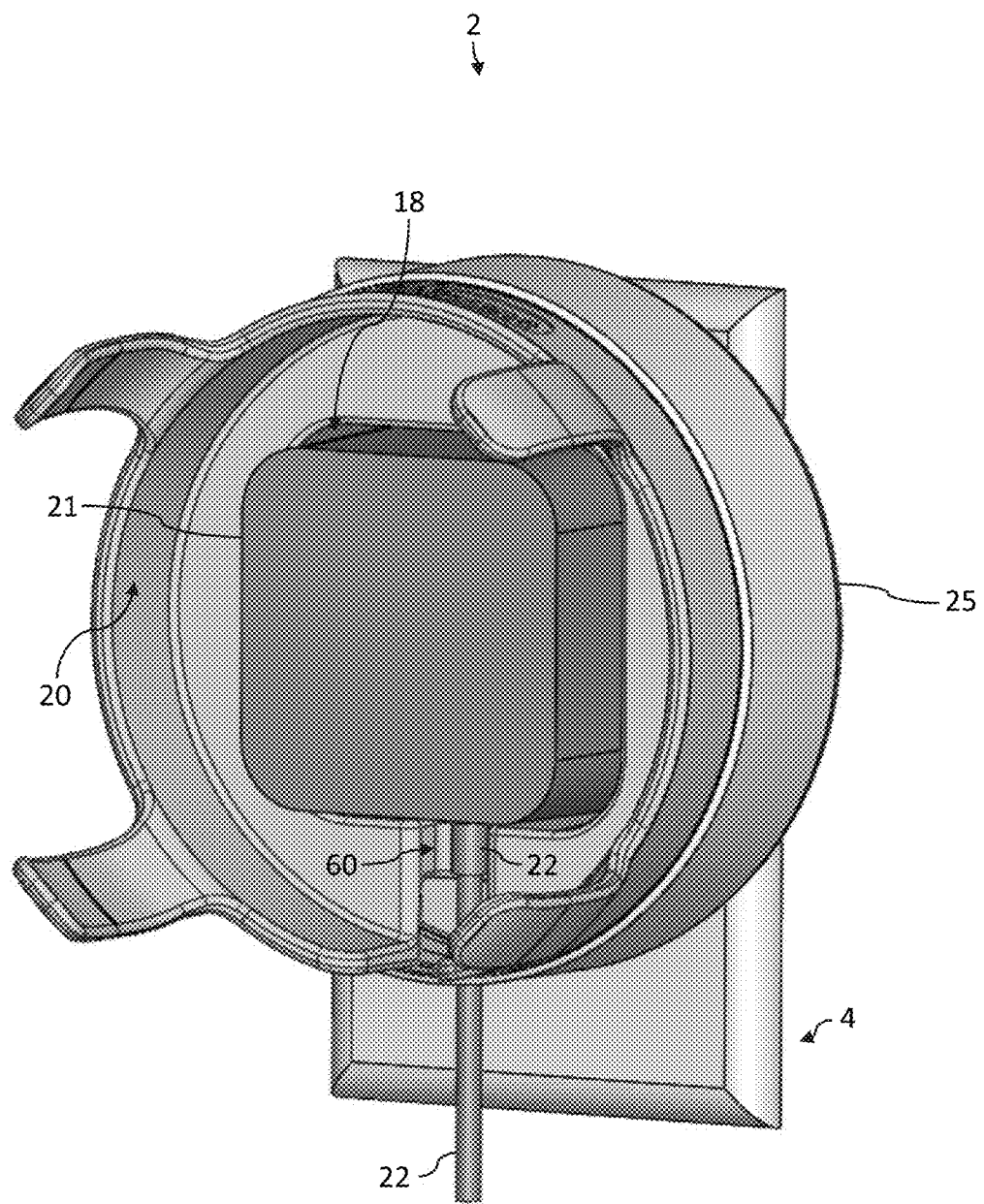
FIGS. 9 and 10 illustrate perspective views of a mounting system configured to couple an electronic device to a power outlet, according to some embodiments.
Figure 10:
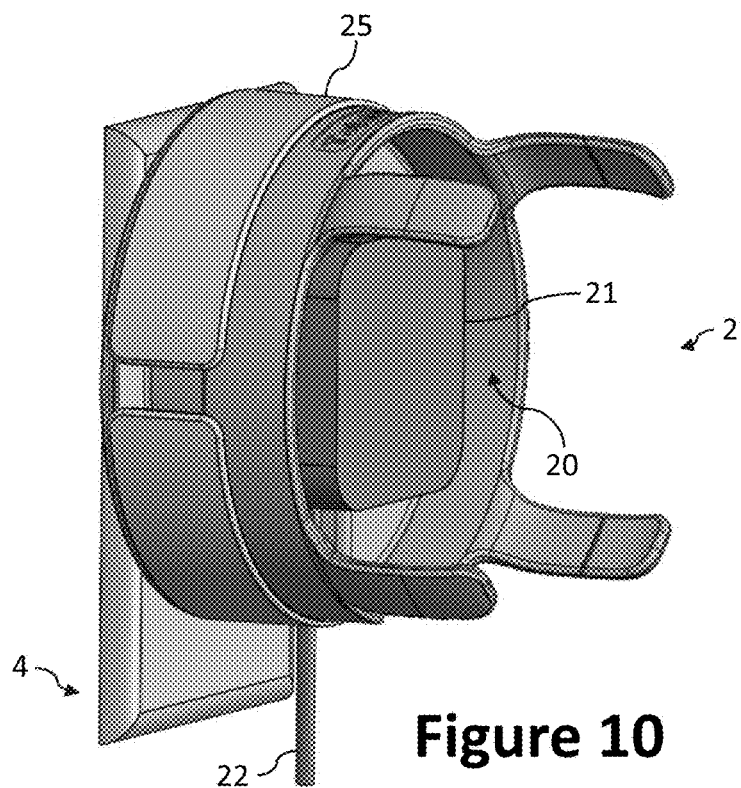

FIG. 9 illustrates a cylindrical sleeve with a cut out area (such that the sleeve does not form a full cylinder). The sleeve can cover the cable wrap area. A user can flex the sleeve to enlarge the sleeve (e.g., to increase the inner and outer diameters of the sleeve) to move the sleeve into position over the cable wrap area. The cable can exit the cable wrap area through a slot in the sleeve.

Not all features are labeled in every figure in order to increase the clarity of certain features in each figure.

Some embodiments comprise a mounting system 2 configured to couple an electronic device 3, 3a, 3b to a wall 6 of a building. The wall 6 can comprise an electrical power outlet 4 such that the power outlet 4 couples the mounting system 2 to the wall 6.

Mounting systems 2 can comprise a base 8 having a backside 9 configured to face inward towards the wall 6 and a frontside 10 configured to face outward away from the wall 6. Mounting system 2 can comprise a first wall 11 coupled to the base 8 and configured to couple the electronic device 3 to the base 8.

In some embodiments, mounting systems 2 comprise a first cantilever beam 14 and a second cantilever beam 14, which can be outward protrusions. Cantilever beams 14 can be flex arms configured to flex to enable coupling an electronic device 3 to the mounting system 2.

FIG. 5 includes arrow 15 to illustrate a radially outward direction in which a flex arm 17 (e.g., beam 14) can flex in response to a user inserting an electronic device 3.

The first cantilever beam 14 and the second cantilever beam 14 can be coupled to the base 8 and can be configured to removably couple the electronic device 3 to the base 8. The mounting system 2 can comprise a first cavity 18 configured to hold at least a portion of a power adapter 21 of the electronic device 3. The mounting system 2 can comprise a first channel 23 that wraps around the first cavity 18. The first channel 23 can be configured to store a cable 22 coupled to the power adapter 21 and wound around the first channel 23.

In several embodiments, the mounting system 2 comprises a removable tube 25 having a slot 27 between a first side 28 of the tube 25 and a second side 29 of the tube 25. The tube 25 can be configured to flex to enlarge the slot 27 to enable an inner diameter of the tube 25 to increase to enable placing the tube 25 at least partially over the first channel 23 to at least partially hide the cable 22.

In several embodiments, the mounting system 2 comprises a removable pin 35 having an outer electrically insulative layer such that the pin 35 is configured to not conduct electricity. The outer electrically insulative layer can be plastic such as ABS. The outer electrically insulative layer can be any suitable electrically insulative material.

The pin 35 can be located partially in a hole 37 of the base 8 such that a first portion of the pin 35 is located in a ground hole 38 of a power outlet 4 of the wall 6 and an outward portion of the pin 35 comprises a shoulder 46 that is too large to fit through the hole 37. The shoulder 46 can be located outward relative to the hole 37. The pin 35 can comprise a cylindrical protrusion. The pin 35 can comprise a cylinder having a length that is at least three times a diameter of the cylinder. The shoulder 46 of the pin 35 can comprise a cylinder having a diameter that is at least 25 percent greater than a diameter of the cylindrical protrusion.

In some embodiments, the base 8 comprises a second wall 47 configured to be located between a power adapter 21 of the electronic device 3 and a power outlet 4 of the wall 6.

In several embodiments, the second wall 47 comprises at least one hole 39 configured to enable a power prong 63 of the power adapter 21 to pass through the hole 39 and into an electrical hole 40 of the power outlet 4.

In several embodiments, the mounting system 2 comprises the power adapter 21. The mounting system 2 can comprise a first outward facing cavity 18. The second wall 47 can be located on an inward end 43 of the first outward facing cavity 18. The power adapter 21 can be located at least partially inside the first outward facing cavity 18.

In some embodiments, the mounting system 2 comprises a second outward facing cavity 20 having a second outward facing opening that is larger than a first outward facing opening of the first outward facing cavity 18. An inward end 44 of the second outward facing cavity 20 can comprise an entrance hole 42 to the first outward facing cavity 18. The power adapter 21 can be located at least partially in both the first outward facing cavity 18 and the second outward facing cavity 20.

In several embodiments, the power adapter 21 is located at least partially in both the first outward facing cavity 18 and the second outward facing cavity 20 such that there is a first gap of at least 8 millimeters between a first sidewall 48 of the second outward facing cavity 20 and a first sidewall 49 of the power adapter 21. There can be a second gap of at least 8 millimeters between a second sidewall 50 of the second outward facing cavity 20 and a second sidewall 51 of the power adapter 21. The second sidewall of the second outward facing cavity 20 can be located on an opposite side of the power adapter 21 relative to the first sidewall of the second outward facing cavity 20. The first gap and the second gap can be configured to enable a user (e.g., a person) to insert fingers into the second outward facing cavity 20 to grip the first and second sidewalls of the power adapter 21 to enable the user to pull the power adapter 21 outward away from the power outlet 4. As used herein, a thumb is considered one of a person's fingers.

In some embodiments, the mounting system 2 comprises a first outward facing cavity 18, the second wall 47 is located on an inward end 43 of the first outward facing cavity 18, and the first outward facing cavity 18 is configured to hold at least a portion of the power adapter 21. The first outward facing cavity 18 can comprise a central axis oriented from the inward end 43 to an outward opening of the first outward facing cavity 18. The mounting system 2 can comprise a second channel 60 having an outward facing opening. The second channel 60 can be oriented within thirty degrees of perpendicular to the central axis such that the second channel 60 is configured to receive an electrical cable 22 through the outward facing opening of the second channel 60 in response to inserting the power adapter 21 (that is coupled to the cable 22) at least partially into the first outward facing cavity 18.

In several embodiments, the base 8 comprises a second wall 47 configured to be located between a power adapter 21 of the electronic device 3 and a power outlet 4 of the wall 6.

In some embodiments, the mounting system 2 comprises a removable pin 35. The second wall 47 can comprise a hole 37 configured to enable a user to insert the pin 35 into the hole 37 and into a ground hole 38 of the power outlet 4 such that the pin 35 is configured to help secure the base 8 to the power outlet 4. The pin 35 can comprise an electrically insulative exterior such that the pin 35 is configured to not conduct electricity.

In several embodiments, the pin 35 is located in the hole 37 of the second wall 47 such that an inward portion of the pin 35 is located in the ground hole 38 of the power outlet 4. The pin 35 can comprise an outward portion having a shoulder 46 with a radial dimension configured to prevent the shoulder 46 from passing through the hole 37 of the second wall 47.

In some embodiments, the mounting system 2 comprises a first cavity 18 configured to hold at least a portion of a power adapter 21 of the electronic device 3. The mounting system 2 can comprise a first channel 23 that wraps around the first cavity 18. The first channel 23 can be configured to store a cable 22 that is coupled to the power adapter 21 and wound around the first channel 23.

As illustrated in FIGS. 12-15, the base 8 can comprise a first disk 55 that forms an inward wall 53 of the first channel 23. The base 8 can comprise a second disk 56 that forms an outward wall 54 of the first channel 23.

In several embodiments, the mounting system 2 comprises a removable tube 25 having a slot 27 between a first side 28 of the tube 25 and a second side 29 of the tube 25. The tube 25 can be configured to flex to enlarge the slot 27 to enable placing the tube 25 at least partially over the first channel 23 to at least partially hide the cable 22.

In some embodiments, the mounting system 2 comprises an electronic device 3 and a power adapter 21 having a cable 22 configured to be electrically coupled to the electronic device 3. The base 8 can comprise a first cylinder 57 coupled to a second cylinder 58 that is located outward relative to the first cylinder 57. The power adapter 21 can be located at least partially inside the first cylinder 57 and at least partially inside the second cylinder 58. The cable 22 can be wrapped at least partially around the first cylinder 57.

In several embodiments, the base 8 comprises a cavity 18 in which at least a portion of the power adapter 21 is located. The cavity 18 can comprise a second wall 47 located between the power adapter 21 and a power outlet 4 of the wall 6. The second wall 47 can comprise a hole 39. A power prong 63 of the power adapter 21 can protrude through the hole 39 and into an electrical hole 40 of the power outlet 4. As used herein, protrude, protrudes, and protrusion do not require motion.

In some embodiments, a third cylinder 59 is coupled to the base 8 such that the first cylinder 57 is located between the third cylinder 59 and the second cylinder 58. The first cylinder 57 can comprise a first outer diameter. The second cylinder 58 can comprise a second outer diameter. The third cylinder 59 can comprise a third outer diameter. The first outer diameter can be smaller than the second outer diameter and the third outer diameter such that the second cylinder 58 impedes a portion of the cable 22 that is wrapped around the first cylinder 57 from moving outward and the third cylinder 59 impedes the portion from moving inward.

In several embodiments, the base 8 comprises a cavity 18 in which at least part of the power adapter 21 is located. The cavity 18 can be located at least partially inside the first cylinder 57. The mounting system 2 can comprise a second channel 60 oriented radially inward relative to the first cylinder 57. The second channel 60 can be in fluid communication with the cavity 18 and a cable storage area 34 formed by the first cylinder 57 and the second cylinder 58. The cable 22 can exit the power adapter 21, pass through the second channel 60, and then wrap around the first cylinder 57.

In several embodiments, the mounting system 2 comprises at least two cantilever beams 14 that are coupled to the second cylinder 58, protrude outward from the second cylinder 58, and wrap at least partially around the electronic device 3 to couple the electronic device 3 to the second cylinder 58. The cantilever beams 14 can be configured to flex in response to inserting the electronic device 3 into an area between the cantilever beam 14. As used herein, protrude, protrudes, and protrusion do not require motion.

Figure 11:
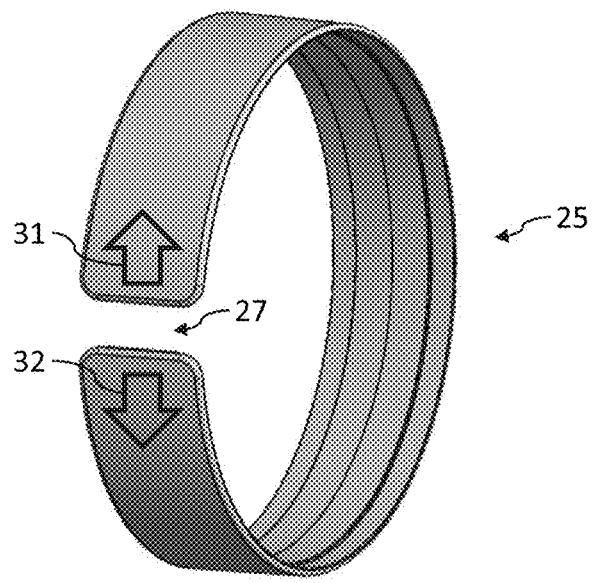
FIG. 11 illustrates a perspective view of a sleeve, according to some embodiments.
Figure 12:
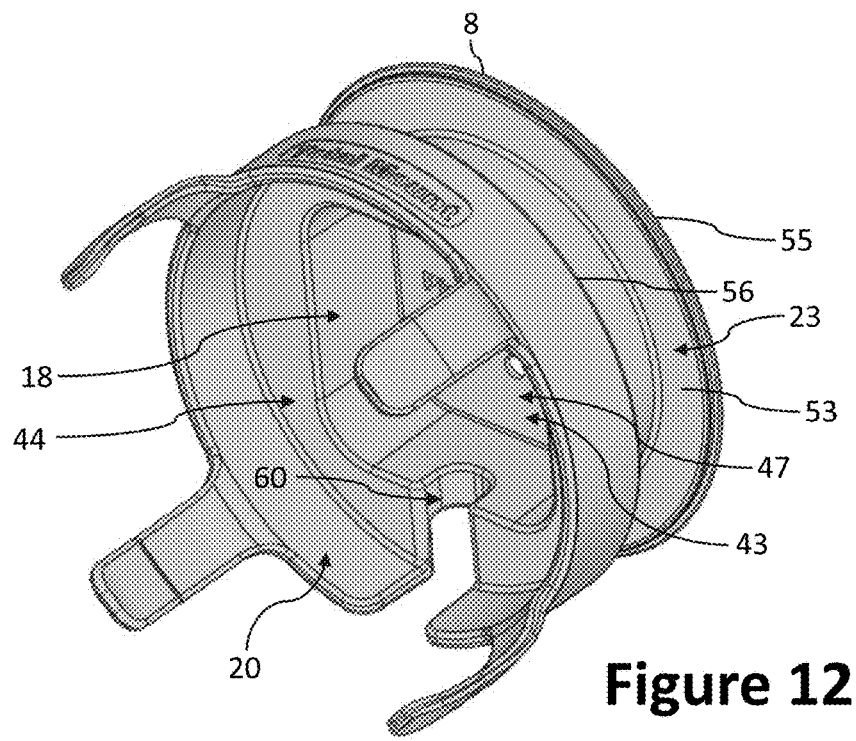
FIGS. 12-14 illustrate perspective views of a mount, according to some embodiments.
Figure 13:
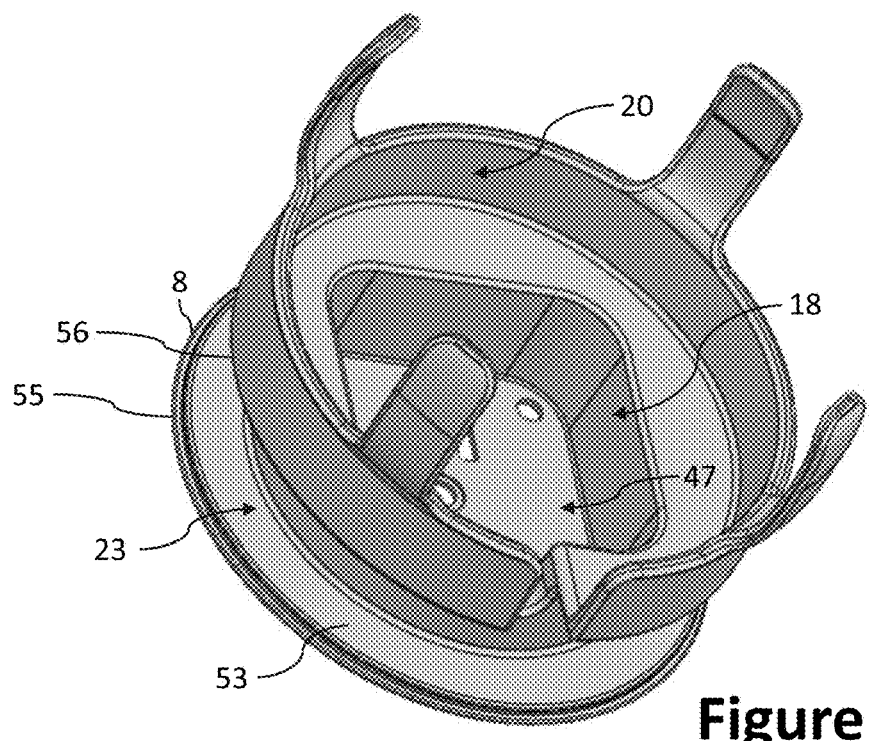
Figure 14:
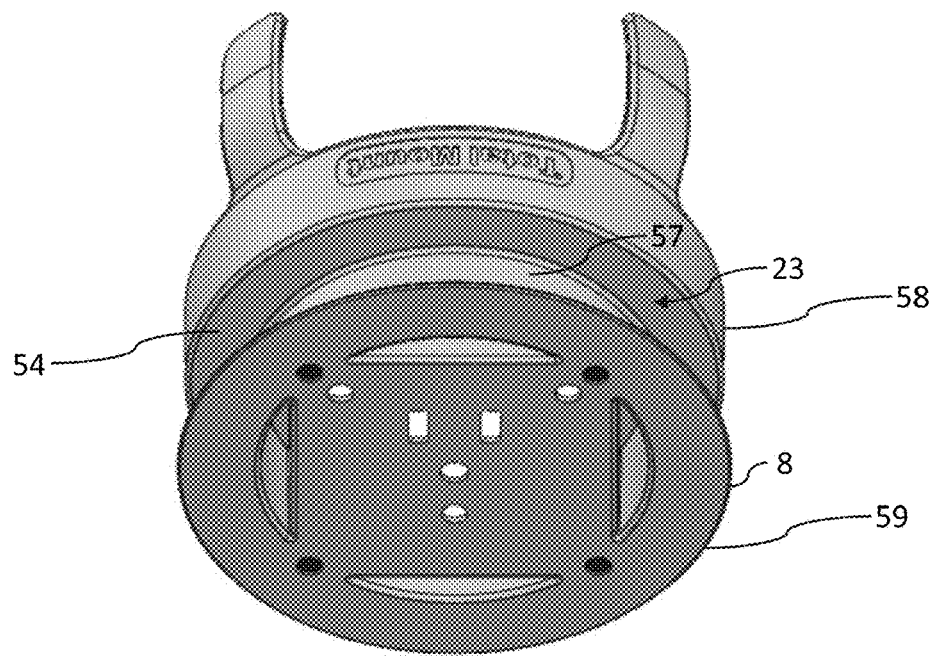
Figure 15:
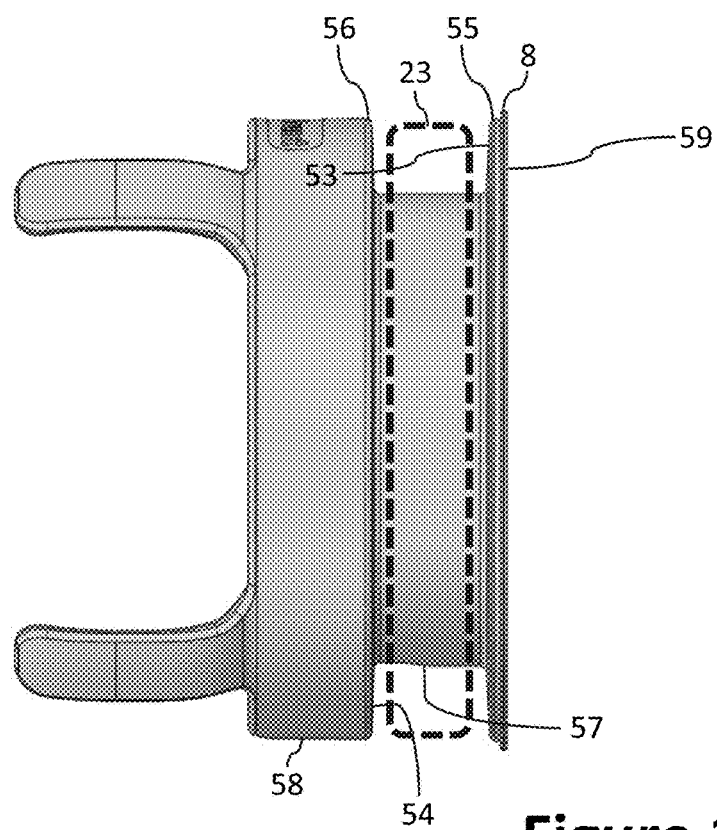
FIG. 15 illustrates a side view of a mount, according to some embodiments.
Figure 16:
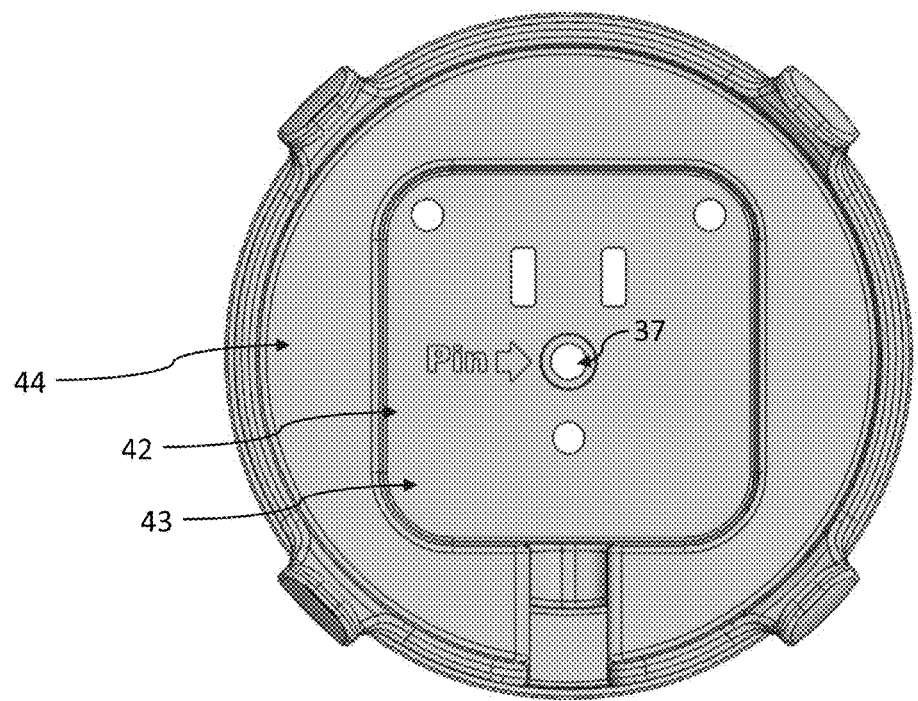
FIG. 16 illustrates a front view of a mount, according to some embodiments.
Figure 17:
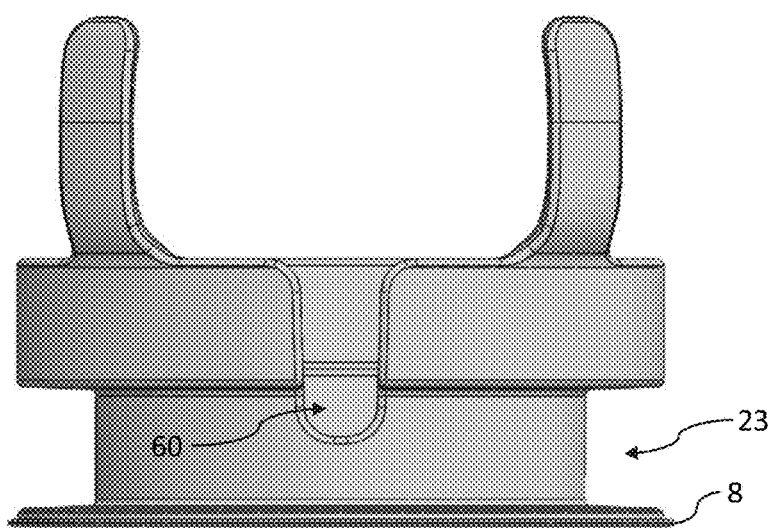
FIG. 17 illustrates a bottom view of a mount, according to some embodiments.
Figure 18:
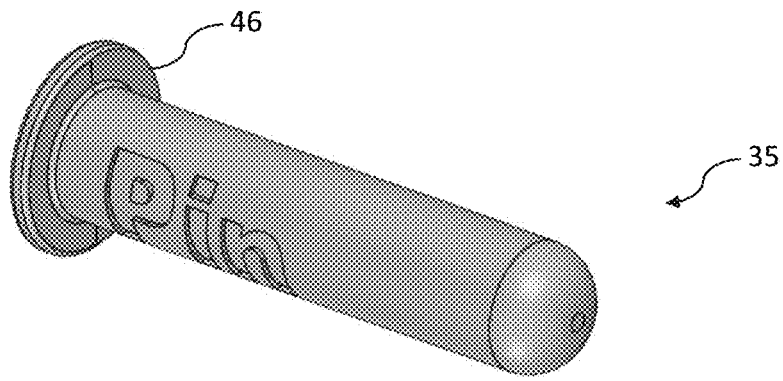
FIGS. 18 and 19 illustrate perspective views of a pin, according to some embodiments.
Figure 19:
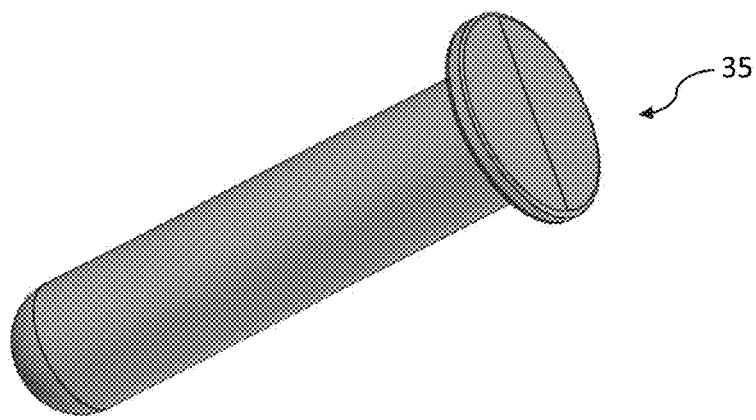
Figure 20:
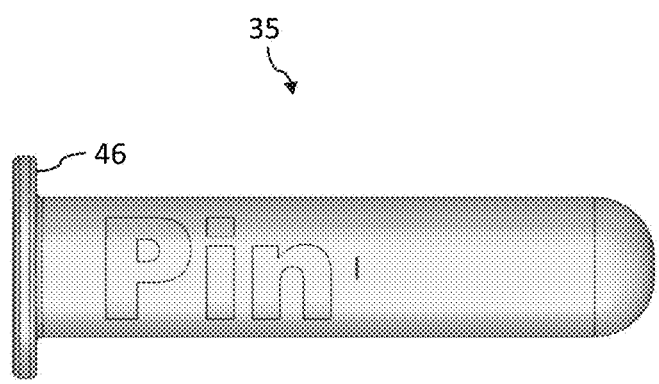
FIG. 20 illustrates a side view of a pin, according to some embodiments.
Figure 21:
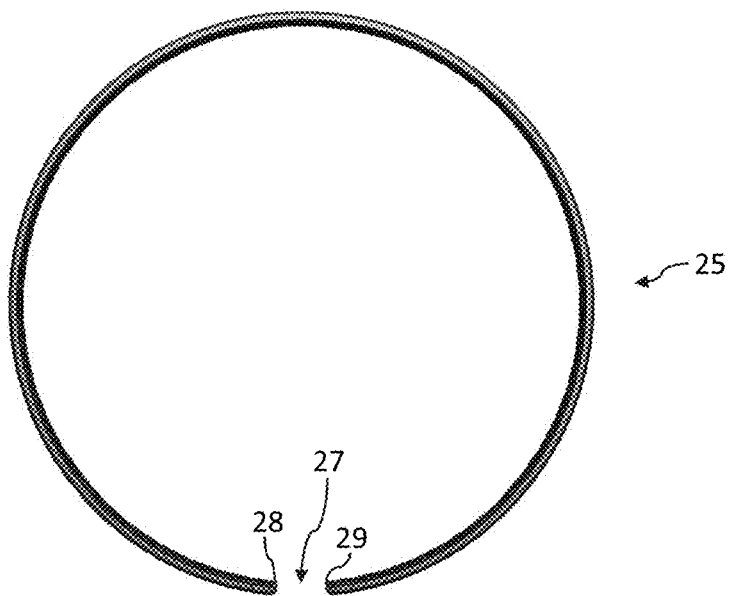
FIG. 21 illustrates a front view of a sleeve, according to some embodiments.
Figure 22:
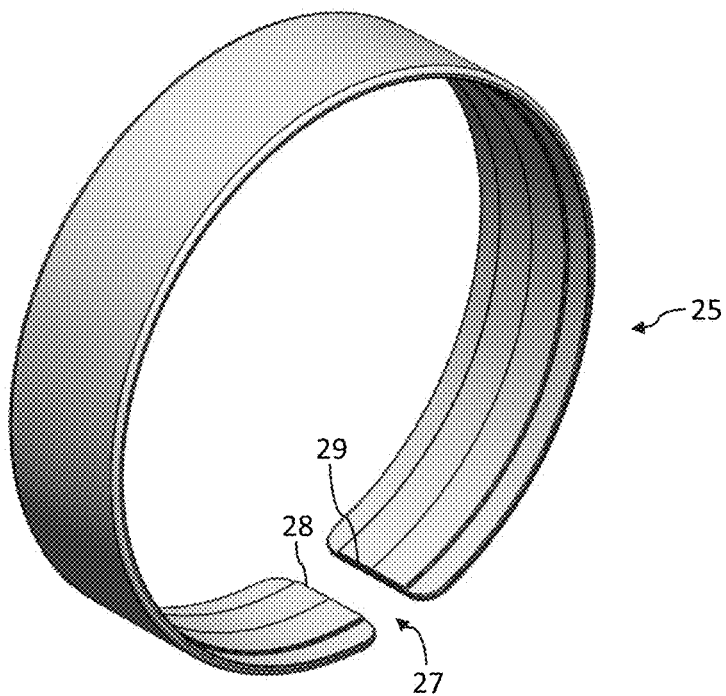
FIG. 22 illustrates a perspective view of a sleeve, according to some embodiments.
Figure 23:
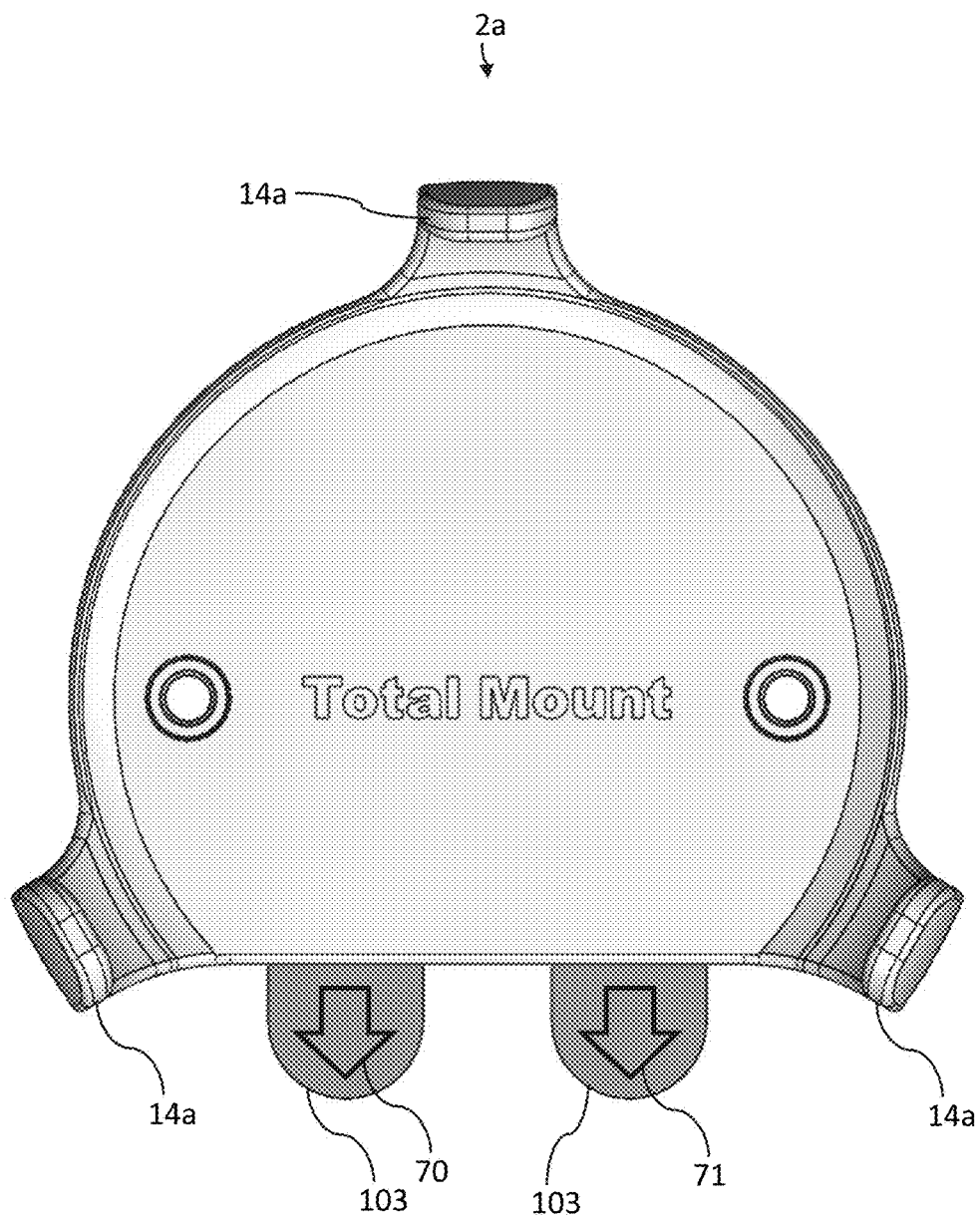
FIG. 23 illustrates a front view of a mounting system that can be coupled to a wall with screws and/or adhesive strips, according to some embodiments.

In some embodiments, the mounting system 2 comprises a C-shaped sleeve 25 having a slot 27 between a first side 28 of the sleeve 25 and a second side 29 of the sleeve 25. The sleeve 25 can be configured to flex to enlarge the slot 27 to enable placing the sleeve 25 at least partially around the first cylinder 57. Arrows 31, 32 in FIG. 11 illustrate the slot 27 expanding to increase an inner diameter of the sleeve 25 to enable placing the sleeve 25 over the cable wrap area 34 (labeled in FIGS. 7 and 8). FIG. 9 illustrates the sleeve 25 after it has been placed over the cable wrap area 34.

The sleeve 25 can be located at least partially around the first cylinder 57 such that the sleeve 25 at least partially hides a portion of the cable 22 that is wrapped around the first cylinder 57.

Unless otherwise indicated herein, "inward" is used in a broad sense to mean a direction towards a wall (of the building) to which the mount is coupled. Unless otherwise indicated herein, "outward" is used in a broad sense to mean a direction away from the wall (of the building) to which the mount is coupled. A side of the mounting system configured to face towards the wall is an inward side even if the wall is not yet present. A side of the mounting system configured to face away from the wall is an outward side even if the wall is not yet present.

FIGS. 1-22 illustrate a mounting system 2 and/or optional components of the mounting system 2. Some embodiments do not include all of the components and/or include substitute components configured to achieve similar functions.

FIGS. 23-27 illustrate a mounting system 2a and/or optional components of the mounting system 2a. Some embodiments do not include all of the components and/or include substitute components configured to achieve similar functions.

The entire contents of the following application are incorporated by reference herein: U.S. patent application Ser. No. 16/045,581; filed Jul. 25, 2018; and entitled MOUNTING SYSTEMS FOR ELECTRONIC DEVICES.

FIGS. 36-38 of U.S. patent application Ser. No. 16/045,581 illustrate an embodiment comprising adhesive 79 that couples the mounting system 2e to a wall of a building. The adhesive 79 can be Command Strips made by the 3M Company having an office in Maplewood, Minn. FIGS. 23-27 of the present application also illustrate an embodiment with adhesive 79 that is configured to couple the mounting system 2a to a wall 6 of a building. The adhesive 79 comprises a pull tab 103. The pull tab 103 is configured to enable a user to uncouple the mounting system 2a from the wall 6 by pulling the pull tab 103 (e.g., in the direction illustrated by arrows 70, 71 in FIG. 23).

Figure 24:
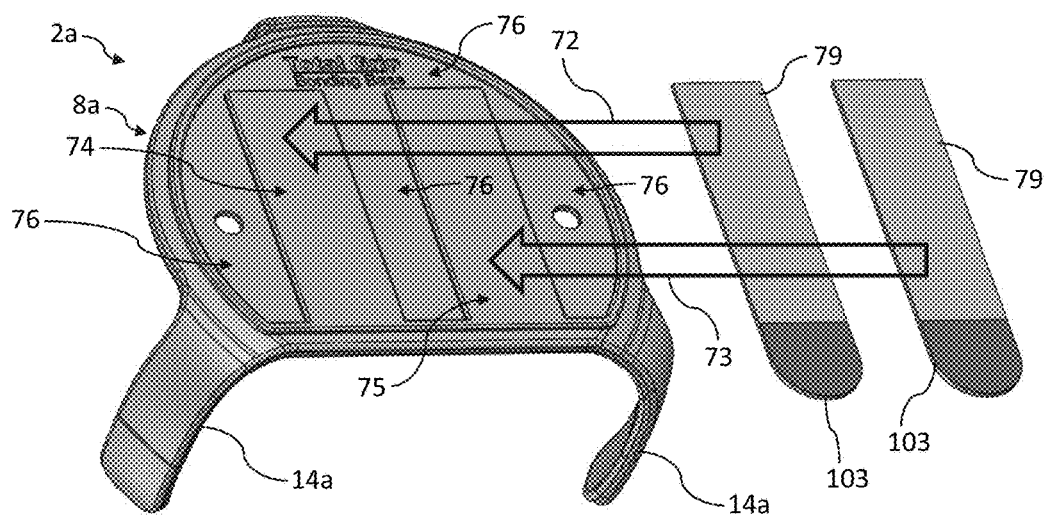
FIG. 24 illustrates a perspective view that includes an inward side of the mounting system shown in FIG. 23, according to some embodiments.
Figure 25:
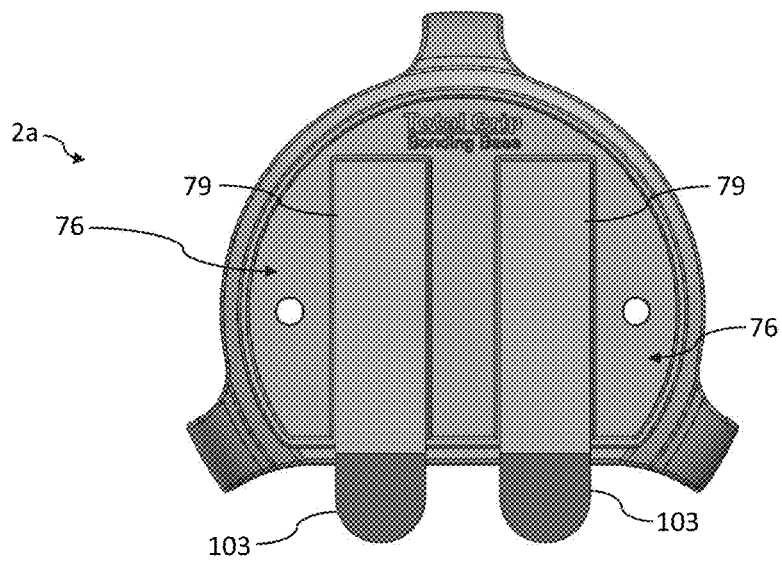
FIG. 25 illustrates a back view of the mounting system shown in FIG. 23, according to some embodiments.
Figure 26:
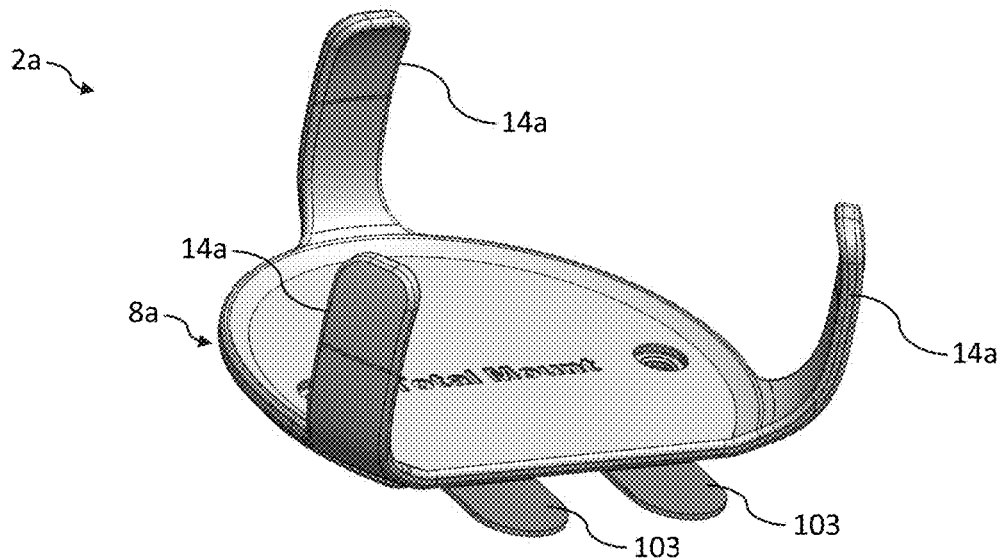
FIG. 26 illustrates a perspective view that includes a front of the mounting system shown in FIG. 23, according to some embodiments.
Figure 27:
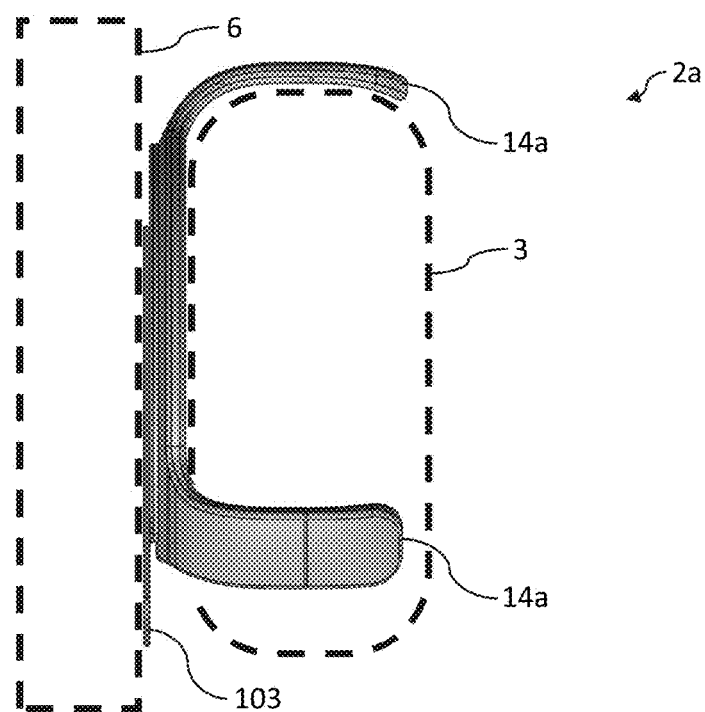
FIG. 27 illustrates a side view of the mounting system shown in FIG. 23 coupled to a wall of a building, according to some embodiments.

Arrows 72, 73 in FIG. 24 illustrate how the adhesive strips 79 can be placed on inwardly protruding platforms 74, 75 on an inwardly facing side of a base 8a of the mounting system 2a. The inwardly facing side of the base 8a can comprise an indentation 76 that forms the inwardly protruding platforms 74, 75. The platforms 74, 75 can be planar and/or rectangular.

The mounting system 2a can comprise any of the features described in the context of the mounting system 2. The mounting system 2 can comprise any of the features described in the context of the mounting system 2a. To avoid unnecessary redundancy, not all features are described in the context of both mounting systems 2, 2a.

Interpretation

None of the steps described herein is essential or indispensable. Any of the steps can be adjusted or modified. Other or additional steps can be used. Any portion of any of the steps, processes, structures, and/or devices disclosed or illustrated in one embodiment, flowchart, or example in this specification can be combined or used with or instead of any other portion of any of the steps, processes, structures, and/or devices disclosed or illustrated in a different embodiment, flowchart, or example. The embodiments and examples provided herein are not intended to be discrete and separate from each other.

The section headings and subheadings provided herein are nonlimiting. The section headings and subheadings do not represent or limit the full scope of the embodiments described in the sections to which the headings and subheadings pertain. For example, a section titled "Topic 1" may include embodiments that do not pertain to Topic 1 and embodiments described in other sections may apply to and be combined with embodiments described within the "Topic 1" section.

Some of the devices, systems, embodiments, and processes use computers. Each of the routines, processes, methods, and algorithms described in the preceding sections may be embodied in, and fully or partially automated by, code modules executed by one or more computers, computer processors, or machines configured to execute computer instructions. The code modules may be stored on any type of non-transitory computer-readable storage medium or tangible computer storage device, such as hard drives, solid state memory, flash memory, optical disc, and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and subcombinations are intended to fall within the scope of this disclosure. In addition, certain method, event, state, or process blocks may be omitted in some implementations. The methods, steps, and processes described herein are also not limited to any particular sequence, and the blocks, steps, or states relating thereto can be performed in other sequences that are appropriate. For example, described tasks or events may be performed in an order other than the order specifically disclosed. Multiple steps may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require at least one of X, at least one of Y, and at least one of Z to each be present.

The term "and/or" means that "and" applies to some embodiments and "or" applies to some embodiments. Thus, A, B, and/or C can be replaced with A, B, and C written in one sentence and A, B, or C written in another sentence. A, B, and/or C means that some embodiments can include A and B, some embodiments can include A and C, some embodiments can include B and C, some embodiments can only include A, some embodiments can include only B, some embodiments can include only C, and some embodiments can include A, B, and C. The term "and/or" is used to avoid unnecessary redundancy.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions, and changes in the form of the methods and systems described herein may be made without departing from the spirit of the inventions disclosed herein.

The invention claimed is:

1. A mounting system configured to couple an electronic device to a building wall, the mounting system comprising:
   a base having a backside configured to face inward towards the building wall and a frontside configured to face outward away from the building wall;
   a first wall coupled to the base and configured to couple the electronic device to the base;
   first and second cantilever beams coupled to the base and configured to removably couple the electronic device to the base;
   a first cavity configured to hold at least a portion of a power adapter of the electronic device; and
   a channel that wraps around the first cavity, wherein the channel is configured to store a cable coupled to the power adapter and wound around the channel.

2. The mounting system of claim 1, further comprising a tube having a slot between a first side of the tube and a second side of the tube, wherein the tube is configured to flex to enlarge the slot to enable an inner diameter of the tube to increase to enable placing the tube at least partially over the channel to at least partially hide the cable.

3. The mounting system of claim 1, further comprising a removable pin having an outer electrically insulative layer such that the pin is configured to not conduct electricity, wherein the pin is located partially in a hole of the base such that a first portion of the pin is located in a ground hole of a power outlet of the building wall and an outward portion of the pin comprises a shoulder that is too large to fit through the hole and that is located outward relative to the hole.

4. The mounting system of claim 1, wherein the base comprises a second wall configured to be located between the power adapter of the electronic device and a power outlet of the building wall, and the second wall comprises at least one hole configured to enable a power prong of the power adapter to pass through the hole and into an electrical hole of the power outlet.

5. A mounting system configured to couple an electronic device to a building wall, the mounting system comprising:
   a base having a backside configured to face inward towards the building wall and a frontside configured to face outward away from the building wall;
   a first wall coupled to the base and configured to couple the electronic device to the base;
   a power adapter of the electronic device, wherein the base comprises a second wall configured to be located between the power adapter of the electronic device and a power outlet of the building wall; and
   a first outward facing cavity, wherein the second wall is located on an inward end of the first outward facing cavity, and the power adapter is located at least partially inside the first outward facing cavity.

6. The mounting system of claim 5, further comprising a second outward facing cavity having a second outward facing opening that is larger than a first outward facing opening of the first outward facing cavity, wherein an inward end of the second outward facing cavity comprises an entrance hole to the first outward facing cavity, wherein the power adapter is located at least partially in both the first outward facing cavity and the second outward facing cavity.

7. The mounting system of claim 6, wherein the power adapter is located at least partially in both the first outward facing cavity and the second outward facing cavity such that there is a first gap of at least 8 millimeters between a first sidewall of the second outward facing cavity and a first sidewall of the power adapter, and there is a second gap of at least 8 millimeters between a second sidewall of the second outward facing cavity and a second sidewall of the power adapter, wherein the second sidewall of the second outward facing cavity is located on an opposite side of the power adapter relative to the first sidewall of the second outward facing cavity, and the first gap and the second gap are configured to enable a user to insert fingers into the second outward facing cavity to grip the first and second sidewalls of the power adapter to enable the user to pull the power adapter outward away from the power outlet.

8. A mounting system configured to couple an electronic device to a building wall, the mounting system comprising:
- a base having a backside configured to face inward towards the building wall and a frontside configured to face outward away from the building wall;
- a first wall coupled to the base and configured to couple the electronic device to the base, wherein the base comprises a second wall configured to be located between a power adapter of the electronic device and a power outlet of the building wall; and
- a first outward facing cavity, wherein the second wall is located on an inward end of the first outward facing cavity, and the first outward facing cavity is configured to hold at least a portion of the power adapter,
- wherein the first outward facing cavity comprises a central axis oriented from the inward end to an outward opening of the first outward facing cavity, wherein the mounting system further comprises a channel having an outward facing opening, wherein the channel is oriented within thirty degrees of perpendicular to the central axis such that the channel is configured to receive an electrical cable through the outward facing opening of the channel in response to inserting the power adapter, that is coupled to the cable, at least partially into the first outward facing cavity.

9. A mounting system configured to couple an electronic device to a building wall, the mounting system comprising:
- a base having a backside configured to face inward towards the building wall and a frontside configured to face outward away from the building wall;
- a first wall coupled to the base and configured to couple the electronic device to the base, wherein the base comprises a second wall configured to be located between a power adapter of the electronic device and a power outlet of the building wall; and
- a removable pin, wherein the second wall comprises a hole configured to enable a user to insert the pin into the hole and into a ground hole of the power outlet such that the pin is configured to help secure the base to the power outlet, wherein the pin comprises an electrically insulative exterior such that the pin is configured to not conduct electricity.

10. The mounting system of claim 9, wherein the pin is located in the hole of the second wall such that an inward portion of the pin is located in the ground hole of the power outlet, and the pin comprises an outward portion having a shoulder with a radial dimension configured to prevent the shoulder from passing through the hole of the second wall.

11. A mounting system configured to couple an electronic device to a building wall, the mounting system comprising:
- a base having a backside configured to face inward towards the building wall and a frontside configured to face outward away from the building wall;
- a first wall coupled to the base and configured to couple the electronic device to the base;
- a first cavity configured to hold at least a portion of a power adapter of the electronic device; and
- a channel that wraps around the first cavity and that is configured to store a cable coupled to the power adapter and wound around the channel, wherein the base comprises a first disk that forms an inward wall of the channel, and the base comprises a second disk that forms an outward wall of the channel.

12. The mounting system of claim 11, further comprising a tube having a slot between a first side of the tube and a second side of the tube, wherein the tube is configured to flex to enlarge the slot to enable placing the tube at least partially over the channel to at least partially hide the cable.

13. A mounting system configured to couple an electronic device to a building wall, the mounting system comprising:
- a base having a backside configured to face inward towards the building wall and a frontside configured to face outward away from the building wall; and
- a first wall coupled to the base and configured to couple the electronic device to the base,
- wherein the mounting system further comprises the electronic device and a power adapter having a cable configured to be electrically coupled to the electronic device, wherein the base comprises a first cylinder coupled to a second cylinder that is located outward relative to the first cylinder, the power adapter is located at least partially inside the first and second cylinders, and the cable is wrapped at least partially around the first cylinder.

14. The mounting system of claim 13, wherein the base comprises a cavity in which at least a portion of the power adapter is located, the cavity comprises a second wall located between the power adapter and a power outlet of the building wall, the second wall comprises a hole, and a power prong of the power adapter protrudes through the hole and into an electrical hole of the power outlet.

15. The mounting system of claim 13, further comprising a third cylinder coupled to the base such that the first cylinder is located between the third cylinder and the second cylinder, wherein the first cylinder comprises a first outer diameter, the second cylinder comprises a second outer diameter, and the third cylinder comprises a third outer diameter, wherein the first outer diameter is smaller than the second and third outer diameters such that the second cylinder impedes a portion of the cable that is wrapped around the first cylinder from moving outward and the third cylinder impedes the portion from moving inward.

16. The mounting system of claim 13, wherein the base comprises a cavity in which at least part of the power adapter is located, wherein the cavity is located at least partially inside the first cylinder, the mounting system further comprising a channel oriented radially inward relative to the first cylinder, wherein the channel is in fluid communication with the cavity and a cable storage area formed by the first and second cylinders, wherein the cable exits the power adapter, passes through the channel, and then wraps around the first cylinder.

17. The mounting system of claim 13, further comprising at least two cantilever beams that are coupled to the second cylinder, protrude outward from the second cylinder, and wrap at least partially around the electronic device to couple the electronic device to the second cylinder, wherein the cantilever beams are configured to flex in response to inserting the electronic device into an area between the cantilever beams.

18. The mounting system of claim 13, further comprising a C-shaped sleeve having a slot between a first side of the sleeve and a second side of the sleeve, wherein the sleeve is configured to flex to enlarge the slot to enable placing the sleeve at least partially around the first cylinder, wherein the sleeve is located at least partially around the first cylinder such that the sleeve at least partially hides a portion of the cable that is wrapped around the first cylinder.

* * * * *